(12) United States Patent
Iannotti

(10) Patent No.: US 10,326,200 B2
(45) Date of Patent: Jun. 18, 2019

(54) HIGH IMPEDANCE RF MEMS TRANSMISSION DEVICES AND METHOD OF MAKING THE SAME

(71) Applicant: General Electric Company, Schenectady, NY (US)

(72) Inventor: Joseph Alfred Iannotti, Glenville, NY (US)

(73) Assignee: General Electric Company, Schenectady, NY (US)

( * ) Notice: Subject to any disclaimer, the term of this patent is extended or adjusted under 35 U.S.C. 154(b) by 31 days.

(21) Appl. No.: 15/786,696

(22) Filed: Oct. 18, 2017

(65) Prior Publication Data
US 2019/0115659 A1 Apr. 18, 2019

(51) Int. Cl.
| H01Q 3/26 | (2006.01) |
| H01P 1/12 | (2006.01) |
| B81B 7/00 | (2006.01) |
| H01P 1/18 | (2006.01) |
| H01Q 3/30 | (2006.01) |

(52) U.S. Cl.
CPC ......... *H01Q 3/2682* (2013.01); *B81B 7/0006* (2013.01); *H01P 1/127* (2013.01); *H01P 1/184* (2013.01); *H01Q 3/30* (2013.01)

(58) Field of Classification Search
CPC . H01P 1/10; H01P 1/127; H01P 1/184; H01Q 3/26; H01Q 3/2682
USPC .......................................... 333/101, 103–105
See application file for complete search history.

(56) References Cited

U.S. PATENT DOCUMENTS

| 4,649,393 A * | 3/1987 | Rittenbach | ............... H01Q 3/38 |
| | | | 333/139 |
| 5,757,319 A | 5/1998 | Loo et al. | |
| (Continued) | | | |

FOREIGN PATENT DOCUMENTS

WO 2014142885 A1 9/2014

OTHER PUBLICATIONS

Jianqiang et al., "Research on Improving Lateral Resolution of Ultrasound Phases Array Elements by Using Sparse Matrix," Applied Mechanics and Materials, 2013 Trans Tech Publications, Switzerland, ISSN: 1662-7482, vols. 380-384, pp. 3409-3412.
(Continued)

*Primary Examiner* — Dean O Takaoka
(74) *Attorney, Agent, or Firm* — Ziolkowski Patent Solutions Group, SC; Jean K. Testa

(57) ABSTRACT

An RF transmission system includes an RF source that provides an RF input and one or more RF MEMS transmission devices coupled to the RF source to receive the RF input therefrom and generate output signals for transmission to an RF load. Each of the RF MEMS transmission devices comprises a substrate, a conducting line formed on the substrate to provide signal transmission paths between a signal input of the RF MEMS transmission device and a signal output of the RF MEMS transmission device, and a plurality of switching elements positioned along the conducting line and selectively controllable to define the signal transmission paths between the signal input and the signal output. Each of the RF source and the RF load has a first characteristic impedance and the one or more RF MEMS transmission devices have a second characteristic impedance that is greater than the first characteristic impedance.

21 Claims, 4 Drawing Sheets

(56) References Cited

U.S. PATENT DOCUMENTS

| | | | | |
|---|---|---|---|---|
| 6,191,735 | B1* | 2/2001 | Schineller | H01P 1/185 333/164 |
| 6,281,838 | B1* | 8/2001 | Hong | H01Q 3/36 333/139 |
| 6,307,519 | B1 | 10/2001 | Livingston et al. | |
| 6,650,291 | B1 | 11/2003 | West et al. | |
| 7,068,220 | B2* | 6/2006 | DeNatale | H01P 1/184 333/105 |
| 7,157,993 | B2* | 1/2007 | DeNatale | H01P 1/127 200/181 |
| 7,253,699 | B2 | 8/2007 | Schaffner et al. | |
| 7,570,133 | B1* | 8/2009 | Taft | H01P 1/184 333/156 |
| 7,724,189 | B2* | 5/2010 | Lee | H01Q 21/065 342/374 |
| 8,076,989 | B2 | 12/2011 | Peschke et al. | |
| 10,199,703 | B2* | 2/2019 | Koul | H01P 1/185 |
| 2002/0075094 | A1 | 6/2002 | Bechtle et al. | |
| 2005/0068123 | A1 | 3/2005 | Denatale et al. | |
| 2009/0027268 | A1 | 1/2009 | Coward | |
| 2018/0219286 | A1* | 8/2018 | Lee | H01Q 3/2682 |

OTHER PUBLICATIONS

Li et al., "The Design of Sparse Antenna Array," Institute of Electronics, Chiense Academics of Sciences, Beijing, China, 2008, pp. 1-3.

Bencivenni, "Sparse Array Synthesis of Complex Antenna Elements," Thesis, Department of Signals and Systems, Antenna Systems Division, Chalmers University of Technology, Goteborg, Sweden, 2015, pp. i-52.

Collins, II, "Optimization of the Antenna Pattern of a Phases Array With Failed Elements," Thesis, Department of the Air Force, Air University, Air Force Institute of Technology, Wright-Patterson Air Force Base, Ohio, Dec. 1986, pp. i-77.

Schaffner et al., "A Wideband Beam Switching Antenna Using RF MEMS Switches", IEEE Antennas and Propagation Society International Symposium, Jul. 8-13, 2001, pp. 658-661.

Shin et al., "Optical True Time-Delay Feeder for X-band Phased Array Antennas Composed of 2×2 Optical MEMS Switches and Fiber Delay Lines", IEEE Photonics Technology Letters, vol. 16, No. 5, May 2004, pp. 1364-1366.

Liang et al., "MEMS Based True Time Delay Technology for Phased Antenna Array Systems", Proceedings of Asia-Pacific Microwave Conference 2007, Dec. 1-14, 2007, pp. 1-4.

Dey et al., "Reliability Analysis of Ku-Band 5-bit Phase Shifters Using MEMS SP4T and SPDT Switches", IEEE Transactions on Microwave Theory and Techniques, vol. 63, No. 12, Dec. 2015, pp. 3997-4012.

Chakraborty et al., "Paradigm Phase Shift: RF MEMS Phase Shifters: An Overview," IEEE Microwave Magazine, vol. 18, Issue 1, Jan./Feb. 2017, pp. 22-41.

Fouladi et al., "CMOS-MEMS Tuning and Impedance Matching Circuits for Reconfigurable RF Front-Ends," Abstract, IEEE/MTT-S International Microwave Symposium Digest, Jun. 17-22, 2012, pp. 1-3.

Ma et al., "A K-Band Switched-Line Phase Shifter Using Novel Low-Voltage Low-Loss Rf-Mems Switch," 2017 IEEE Regional Symposium on Micro and Nanoelectronics (RSM), pp. 14-17.

International Search Report and Written Opinion issued in connection with corresponding PCT Application No. PCT/US2018/048090, dated Dec. 28, 2018.

* cited by examiner

HIGH IMPEDANCE RF MEMS TRANSMISSION DEVICES AND METHOD OF MAKING THE SAME

BACKGROUND OF THE INVENTION

Embodiments of the invention relate generally to radio frequency (RF) communications systems, and more particularly to RF micro-electromechanical systems (MEMS) communications systems having a selectively increased characteristic impedance that reduces insertion losses, with the structure of the system also providing for improved yields during fabrication thereof.

RF MEMS devices are a technology that, in its most general form, can be defined as miniature devices that use an electrically actuated mechanical movement to achieve an open circuit or a closed circuit in a RF transmission line. When the RF MEMS device is in an on-position, the RF transmission line is "closed" and the RF MEMS device can be used to conduct a high-frequency RF signal. It is recognized that RF MEMS devices are ideal for providing such switching capability between open and closed circuits due to their desirable RF properties, including low radiative loss, low capacitive open state coupling (300 fFd), and very small mechanical geometry (76 um), resulting in minimal inductive parasitics and relatively low contact resistance (1 ohm).

One application of RF MEMS devices is for use in electronically steered antenna (ESA) systems, which are systems that combine the signals from multiple stationary antenna elements to point a beam of radio waves at a certain angle in space. The characteristics and angle of the beam may be controlled via an electronic steering of the beam in different directions without physically moving the antennas, with true time delay (TTD) being one known technique for doing so. Beam steering via TTD is accomplished by changing the path length or transmission time of each antenna element, which may be achieved by providing a TTD module that includes a plurality of RF MEMS devices coupled to RF transmission lines of various lengths. The amount of time it takes for a signal to be transmitted between the common feed point and the antenna is controlled by selecting a particular combination of transmission lines via switching of the RF MEMS devices, which imparts a desired amount of phase or time delay on the RF signal to each element.

It is recognized, however, that the use of RF MEMS devices and accompanying RF transmission lines for existing RF transmission systems (including ESA systems that utilize TTD) has numerous limitations and challenges associated therewith. One primary challenge is achieving a desired characteristic impedance of 50 Ohms in the system—which is the standard characteristic impedance utilized in most RF transmission systems. That is, due to the size of the RF MEMS devices and RF transmission lines in such systems, it is often difficult to achieve a characteristic impedance of 50 Ohms due to challenges associated with the miniaturization of the system. For example, characteristic impedance may be desirably altered by changing the width of the RF transmission lines or a spacing between the RF transmission lines, but such altering would result in increased resistance in the system (if the RF transmission lines are narrowed) or an increased size of the system (if spacing between the RF transmission lines is increased). As another example, characteristic impedance may be desirably altered by reducing a thickness of the insulating substrate (e.g., glass) upon which the RF transmission lines are formed in the system, but such thinning of the substrate may lead to poorer yields during fabrication due to the fragility of the substrate and potential breakage thereof that might occur with such reduced thickness.

Therefore, it would be desirable to provide an RF MEMS transmission system that provides a desirable characteristic impedance while addressing yield issues during fabrication. It would further be desirable to provide an RF MEMS transmission system with low RF insertion loss (<4 dB) that enables passive beamformer assemblies and maintains good signal transmission for broadband frequency signal processing applications.

BRIEF DESCRIPTION OF THE INVENTION

In accordance with one aspect of the invention, an RF transmission system includes an RF source that provides an RF input and one or more RF MEMS transmission devices coupled to the RF source to receive the RF input therefrom and generate output signals for transmission to an RF load. Each of the one or more RF MEMS transmission devices comprises a substrate, a conducting line formed on the substrate to provide signal transmission paths between a signal input of the RF MEMS transmission device and a signal output of the RF MEMS transmission device, and a plurality of switching elements positioned along the conducting line and selectively controllable to define the signal transmission paths between the signal input and the signal output. Each of the RF source and the RF load has a first characteristic impedance and the one or more RF MEMS transmission devices have a second characteristic impedance that is greater than the first characteristic impedance.

In accordance with another aspect of the invention, a method of manufacturing an RF MEMS transmission device includes forming a substrate, forming a signal line on a top surface of the substrate that includes plurality of line portions, and coupling a MEMS switching device to the signal line, the MEMS switching device operable in a closed position and an open position to selectively couple and decouple respective line portions of the signal line to transmit an RF signal therethrough. Forming the substrate and the signal line comprises selectively controlling a thickness of the substrate and a width of the signal line relative to one another such that, when taken in combination with a length and thickness of the signal line and material properties of the substrate and signal line, a characteristic impedance of the RF MEMS transmission device is higher than a 50 Ohm characteristic impedance of an RF source and an RF load to which the RF MEMS transmission device is connected.

In accordance with yet another aspect of the invention, an RF MEMS transmission device includes a substrate having a thickness, a plurality of MEMS devices disposed on a top surface of the substrate, and conductive signal lines formed on the top surface of the substrate, the conductive signal lines each having a length, width, and thickness. The thickness of the substrate and the width of the conductive signal lines is such that, when taken in combination with others of the thickness of the substrate and the length, width, and thickness of the conductive signal lines, a characteristic impedance of the RF MEMS transmission device is approximately 150 Ohms.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the invention are directed to an RF MEMS transmission system having a selectively increased characteristic impedance that reduces insertion losses, with one or more features of the RF transmission lines being formed to provide the increased characteristic impedance. The RF transmission line may be further structured to increase the durability thereof so as to provide for improved yields during fabrication thereof.

Embodiments of the invention are shown and described here below for use in an RF MEMS transmission system in the form of a radar system that includes radiating antenna elements that receive RF inputs from a true time delay (TTD) beam former or module. However, it is recognized that embodiments of the invention may be implemented with other RF transmission systems other than those specifically shown and described herein. Accordingly, embodiments of the invention are not meant to be limited only to the specific RF MEMS transmission system described herein, but may be utilized in other RF MEMS transmission systems. Furthermore, while a TTD beam former is specifically disclosed here below are being utilized in the radar system, it is recognized that other RF MEMS transmission device that utilize MEMS switches and RFT transmission lines are recognized as being within the scope of the invention.

Figure 1:
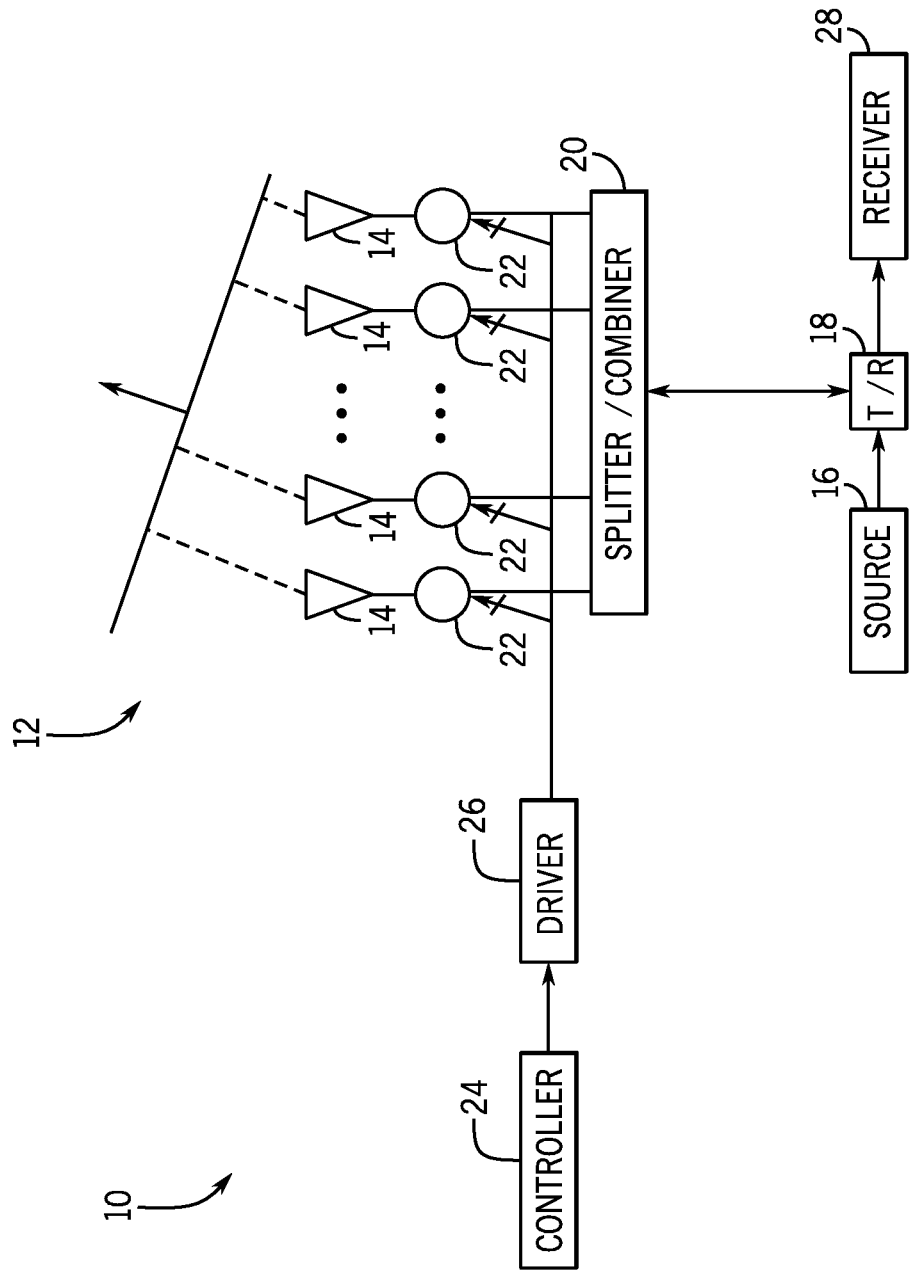
FIG. 1 is a simplified schematic diagram of an RF transmission system, in the form of a radar system with a phased array antenna having beam steering affected with true time delay.

Referring first to FIG. 1, a simplified schematic diagram of a radar system 10 (or alternatively an "RF transmission system") is illustrated according to an embodiment of the invention. The radar system 10 includes an antenna 12 constructed of multiple radiating elements 14 for transmitting and receiving signals. These radiating antenna elements 14 are fed by a source 16 that provides an RF input such as RF modulated signal having a predetermined wavelength. This RF input is transmitted by a transmit/receive switch 18 through a splitter/combiner 20 to a true time delay (TTD) beam former or module 22 corresponding to each antenna element 14. A controller 24 provides drive signals to a driver die 26, which selectively controls switching elements within the TTD module 22 in a manner that generates a time delayed signal. These TTD modules 22 output the time delayed signal to a respective antenna element 14. Signals received by antenna elements 14 are transmitted through splitter/combiner 20 to a receiver 28. While not specifically illustrated in FIG. 1, it is contemplated that embodiments of the invention may be configured for independent beam control of the vertical, horizontal, and circular polarizations and include separate beam controlling circuitry for each polarization.

Figure 2:
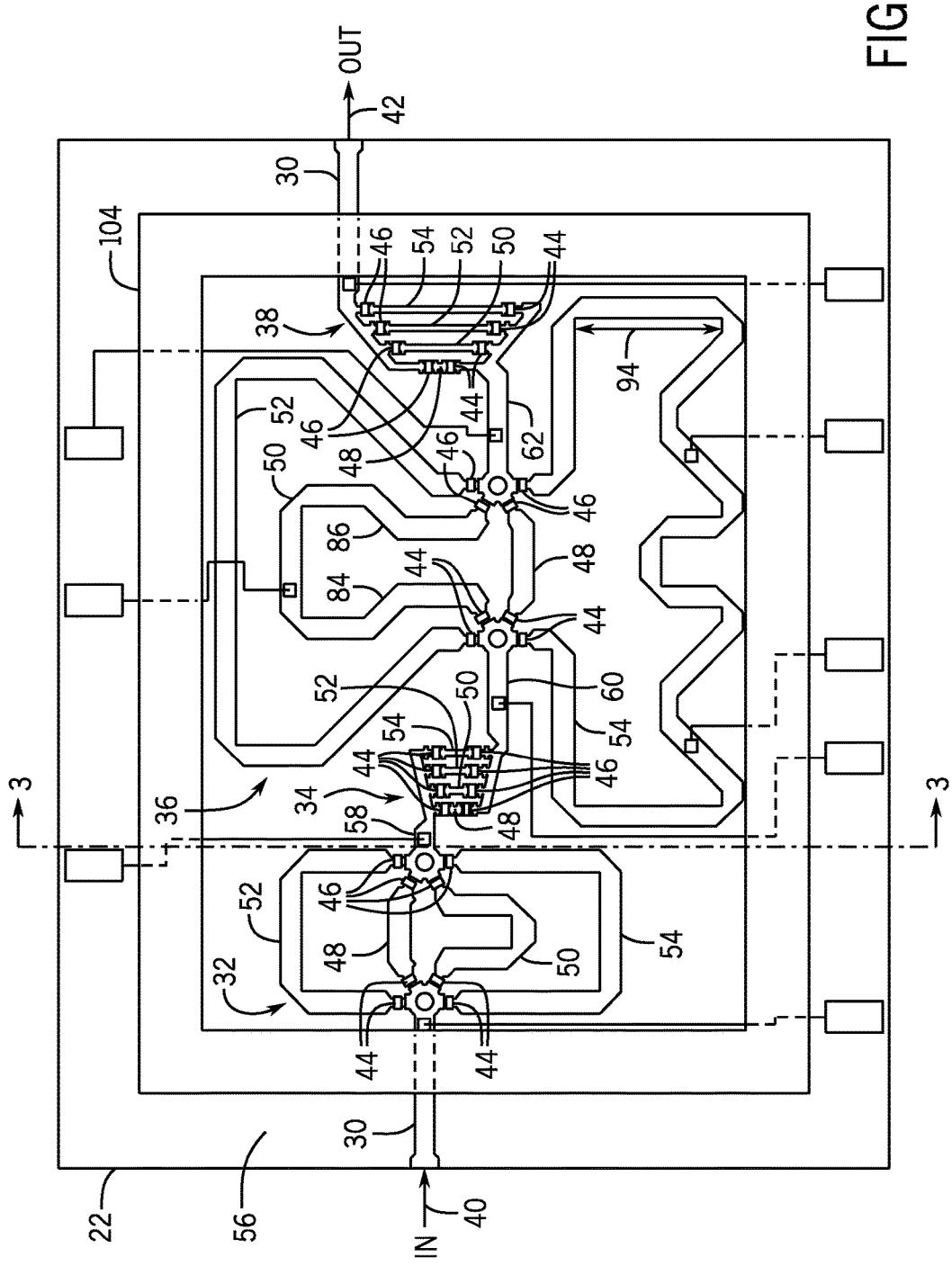
FIG. 2 is a schematic top view of a true time delay (TTD) module useable with the radar system of FIG. 1, according to n embodiment of the invention.

FIG. 2 is a schematic top view of a TTD module 22 incorporated in the radar system or RF transmission system 10 of FIG. 1, according to one embodiment of the invention. The TTD module 22 includes a micro-strip transmission line 30 or signal line patterned on a base substrate 56 to include four (4) sets of time delay stages 32, 34, 36, 38. Micro-strip transmission line 30 is formed using a deposition, patterning, and/or etching technique as known in the art. In a preferred embodiment, base substrate 56 is formed of fused silica, which provides reduced current leakage and improved switch channel isolation. According to alternative embodiments, base substrate 56 may be an insulating, semi-insulating material, or semi-conductive material such as, but not limited to glass, alumina, ceramic, LTCC, HTCC, quartz, polyimide, gallium arsenide, silicon, or germanium. Alternatively, base substrate 56 may be a semiconductor wafer processed to include switching elements or switches 44, 46 and micro-strip transmission line 30.

Micro-strip transmission line 30 may be any conductive material such as, for example, copper, gold, a tungsten/nickel/gold stack, or another common packaging material. As shown, micro-strip transmission line 30 is patterned such that the delay stages 32, 34, 36, 38 are serially connected, with the first delay stage 32 coupled to an RF signal input 40 of the TTD module 22 and the fourth delay stage 38 coupled to the RF signal output 42 of the TTD module 22. Each of the delay stages 32, 34, 36, 38 includes an input electronic switching element 44 and an output electronic switching element 46 that are selectively controlled in either their on or off positions to insert a cumulative time delay in a transmission signal sent to the respective antenna element 14 (FIG. 1), as described in additional detail below. While elements 40 and 42 are described herein as input and output, respectively, it is contemplated that the functionality of elements 40, 42 might be reversed such that element 40 is an RF signal output and element 42 is an RF signal input. Similarly, it is to be understood that switching elements 44 and 46 function as respective "input" and "output" switching elements of respective delay lines 48, 50, 52, 54 when an RF signal travels through TTD module 22 from RF signal element 40 to RF signal element 42 and as "output" and "input" switching elements, respectively, when the signal travels in the reverse direction.

The first delay stage 32 includes four micro-strip delay lines 48, 50, 52, 54 patterned on the base substrate 56 of the TTD module 22. Delay lines 48, 50, 52, 54 have different lengths that impart different time delays to the RF input signal. Delay line 48 has a length L1, delay line 50 has a length L2, delay line 52 has a length L3, and delay line 54 has a length L4, with L1<L2<L3<L4. The phase of the transmission signal is shifted in proportion to the time delay imparted by the delay line 48, 50, 52, 54, with the longest delay line 54 imparting the greatest time delay.

The second, third, and fourth delay stages 34, 36, 38 are formed in a similar manner as the first delay stage 32, with each delay stage 34, 36, 38 including four micro-strip delay lines 48-54 of varying lengths patterned on the base substrate 56. Line segments 58, 60, 62 interconnect the delay stages 32-38. Additional phase shift is imparted to the input signal by each subsequent delay stage 34-38 by selectively closing a given pair of switches 44, 46 on one of the four micro-strip delay lines 48-54 while the remaining pairs of switches are maintained in an open position a similar manner as described above.

Switching devices 44, 46 are positioned on base substrate 56 at the terminal input and terminal output, respectively, of each micro-strip delay line 48-54. In the illustrated embodiment, the micro-strip delay lines 48-54 of the first delay stage 32 and the third delay stage 36 are constructed having a star or fan out configuration and the micro-strip delay lines 48-54 of the second delay stage 34 and the fourth delay stage 38 are constructed having a linear configuration. However, it is contemplated that the delay stages may be constructed having any number alternative configurations based on design specifications of a particular application.

The TTD module 22 disclosed herein is designed as a 256 state beam former, with four (4) delay stages, and a 360 degree delay/phase-shift range. TTD module 22 is operable over the entire Ku-band or over a 10-15 GHz bandwidth. However, it is contemplated that the concepts disclosed herein may be extended to TTD modules having any number of delay stages, with the number of delay stages and the length of the individual delay lines within those stages determined based on the desired amount of delay and resulting beam steering resolution for a particular application. Likewise, while the dimensions of TTD module 22 disclosed herein are approximately 9 mm by 7.5 mm, a skilled artisan will recognize that the dimensions of TTD module may be altered based on the design specifications of a particular application.

According to embodiments of the invention, switches 44, 46 are provided as MEMS devices—such that the TTD module 22 may be referred to as an "RF MEMS transmission device." The MEMS switches 44, 46 may be formed using a build-up technique involving multiple deposition, anodization, patterning, and etching steps. In an exemplary embodiment, MEMS switches 44, 46 have a construction similar to the MEMS switch 64 depicted in FIG. 3, which is illustrated as an ohmic contact switch mechanism. MEMS switch 64 includes a contact 66 and a moveable element 68 such as for example, a cantilevered beam. In some embodiments, the moveable element 68 can be supported by an anchor, which may be integrated with the moveable element 68 and serve to connect the moveable element 68 to an underlying support structure such as base substrate 56. In the illustrated embodiment the moveable element 68 is a cantilevered beam that includes two cantilever portions connected to a common beam portion. However, it is contemplated that moveable element may be configured having alternative geometries in other embodiments. Contact 66, cantilevered beam 68, and electrode 70 are formed at least partially of at least one conductive material such as gold, gold alloy, nickel, nickel alloy, platinum, tantalum, and tungsten, as non-limiting examples. The switch 64 also includes an electrode or driving means 70 that effects a potential difference between the electrode 70 and the cantilevered beam 68.

Figure 3:
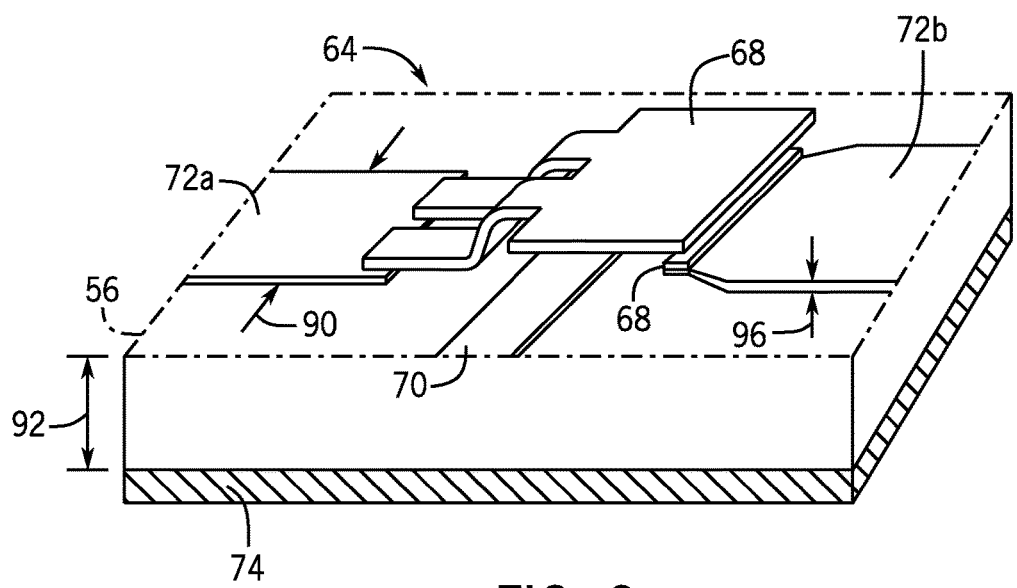
FIG. 3 is a schematic diagram of an exemplary MEMS switching device usable in the TTD module of FIG. 2, according to an embodiment of the invention.

As shown in FIG. 3, the contact 66 and moveable element 68 of switch 44 are formed between two micro-strip lines 72a and 72b patterned on base substrate 56, with the electrode 70 positioned between micro-strip lines 72a and 72b. Switch 44 may be formed on base substrate 56 through a micro fabrication technique, such as, for example, vapor deposition, electroplating, photolithography, wet and dry etching, and the like, such that switch 44 constitutes a portion of a microelectromechanical device, nanoelectromechanical device, or MEMS. In such an embodiment, switch 44 is fabricating having features on the order of ones or tens of micrometers or nanometers.

When appropriately charged, the electrode 70 of MEMS switch 64 generates an electrostatic force that pulls the cantilevered beam 68 toward the electrode 70 and the contact 66. The electrode 70 thus acts as a gate with respect to the switch 44, causing the cantilevered moveable element 68 to move between a non-contacting or "open" position in which the moveable element 68 is separated from the contact 66 (shown in FIG. 4), and a contacting or "closed" position in which the moveable element 68 contacts and establishes electrical communication with the contact 66, thereby closing a circuit between micro-strip lines 72a and 72b.

As further shown in FIG. 3, an embedded micro-strip configuration is provided with MEMS switch 64 (and overall in TTD module 22 of FIG. 2) by including a ground layer 74 below the base substrate 56 along with micro-strip lines 72a and 72b (and micro-strip transmission lines 30, FIG. 2) patterned on base substrate 56—with the micro-strip lines and ground plane layer 74 interacting with each other to create an electromagnetic wave that travels through dielectric substrate 56 to create an RF signal. While a specific grounding configuration is illustrated in FIG. 3, it is contemplated that TTD module 22 may be fabricated having alternative strip-line and embedded micro-strip grounding configurations, such as, for example a grounded coplanar waveguide configuration wherein two ground lines (not shown) are provided coplanar to the micro-strip transmission line 30 on the base substrate 56. In yet another alternative embodiment, TTD module 22 is constructed with an inverted ground plane (not shown) that is positioned above the anchor 30 and base substrate 56.

In operation of TTD module 22, a given delay line, such as delay line 48 of the third delay stage 36 for example, is activated by closing the input switch 44 and output switch 46 on the delay line 48 while maintaining the switches 44, 46 on delay lines 50-54 in an open position. The MEMS switches 44, 46 of TTD module 22 are controlled to move between their open and closed positions by applying a selective gate voltage to the electrode 70 of the MEMS switch 44, 46. This gate voltage is provided through gating lines (not shown) patterned on the base substrate 56, with the gating lines electrically coupling the MEMS switches 44, 46 to gate voltage sources or gate drivers (not shown) that receive power from power sources to establish a potential difference between the contact 66 and the cantilevered beam 68 of the MEMS switches 44, 46 when the switch is in the open position.

With regard to the operation of TTD module 22, it is recognized that ideal operation of the module would be at a characteristic impedance of 50 Ohms—which would typically match with a 50 Ohm source resistance and load resistance found in an RF transmission system. However, it is recognized that it may be difficult to achieve a characteristic impedance of 50 Ohms in TTD module 22 due to the small size of the RF MEMS devices 44, 46 and micro-strip transmission line 30 in the module. For example, characteristic impedance may be lowered in TTD module 22 by increasing a width of the micro-strip transmission line 30, but such altering would result in an increased size of the module. As another example, characteristic impedance may be lowered by reducing a thickness of the substrate 56, such as by forming the substrate with a thickness of 125 µm, but such thinning of the substrate 56 may lead to poorer yields during fabrication due to the fragility of the substrate and potential breakage thereof that might occur with such reduced thickness.

Figure 4A:
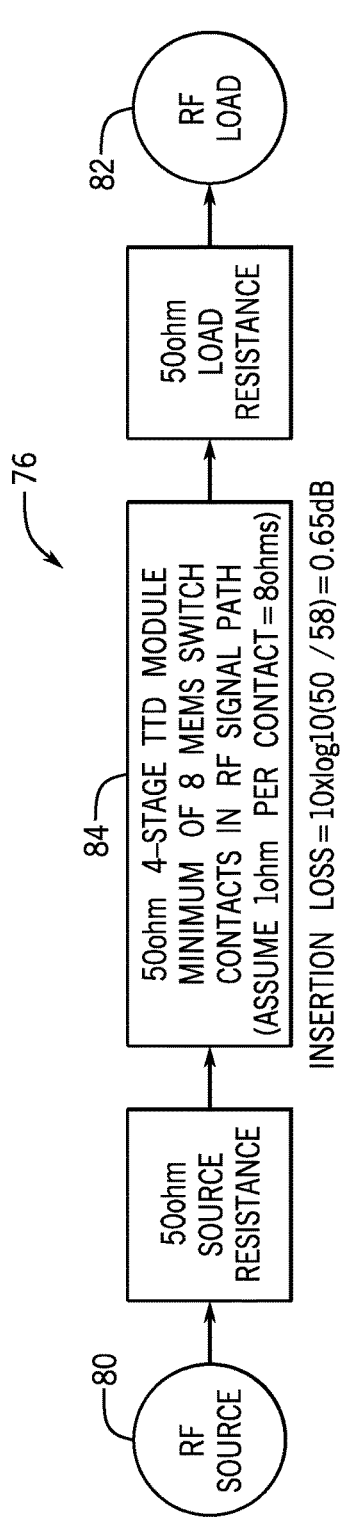
FIG. 4A is a schematic block diagram of a prior art RF transmission system having a 50 Ohm TTD module incorporated therein.
Figure 4B:
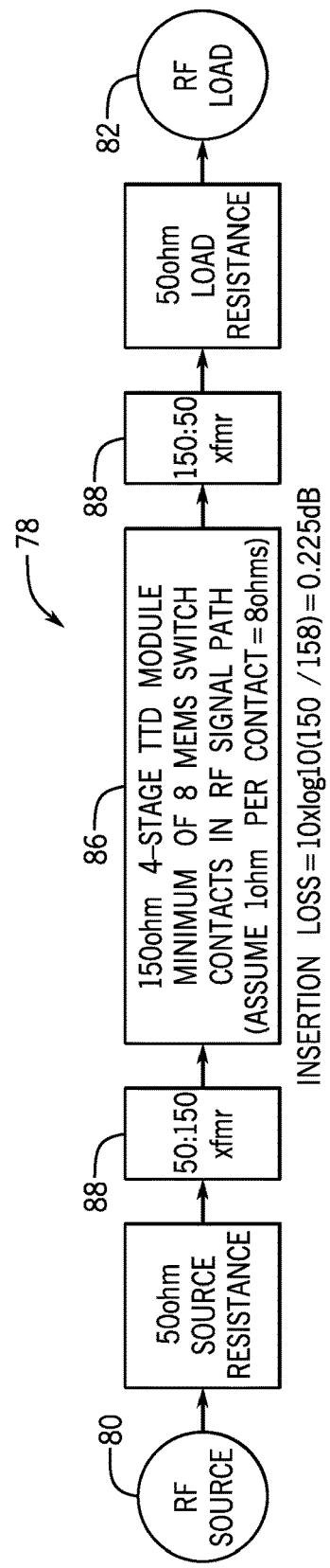
FIG. 4B is a schematic block diagram of an RF transmission system having a 150 Ohm TTD module incorporated therein, according to an embodiment of the invention.

Accordingly, embodiments of the invention are directed to an RF MEMS transmission device (such as TTD module 22) having a selectively increased characteristic impedance. According to an exemplary embodiment, the characteristic impedance in TTD module 22 is increased to a level of 150 Ohms, which minimizes the impact of resistive losses in the micro-strip transmission line 30 and MEMS switches 44, 46 and lowers RF insertion loss, so as enable passive beamformer assemblies and maintain good signal transmission. Block schematic diagrams of a prior art RF MEMS transmission system 76 and an RF MEMS transmission system 78 according to an embodiment of the invention are shown in FIGS. 4A and 4B, respectively. As shown therein, each of the RF MEMS transmission systems 76, 78 includes an RF source 80 and an RF load 82 (e.g., radiating antenna element) that have a characteristic impedance of 50 Ohms. However, the prior art RF MEMS transmission system 76 of FIG. 4A includes a 4-stage TTD module 84 having a characteristic impedance of 50 Ohms (based on the construction thereof, as will be explained in greater detail below), whereas the 4-stage TTD module 86 of FIG. 4B has an increased characteristic impedance of 150 Ohms (based on the construction thereof, as will be explained in greater detail below).

As further shown in FIG. 4B, impedance transformers 88 are provided at the input and output of TTD module 86 to account for differences in the characteristic impedance between the RF source 80, the TTD module 86, and the RF load 82—with the impedance transformers 88 increasing/decreasing the characteristic impedance as required to transition between these impedance values. Such impedance transformers 88 may be of a known construction and function to convert current at one voltage to the same waveform at another voltage, with a balun transformer being one possible device/component to perform the impedance transformation, for example. In another embodiment, the impedance transformers 88 may be formed on the same substrate as the TTD module 86 to enable a 50 Ohm "part" to be created. That is, impedance transformers 88 may be formed on base substrate 56 (FIG. 2) of the TTD module 86 as part of the fabrication thereof, so as to be considered an integral part/component of the TTD module—with the TTD module 86 functioning as a 50 Ohm device.

According to embodiments of the invention, and in order to increase the characteristic impedance in TTD module 22, 86, one or more of a width of the micro-strip transmission lines 30 and a thickness of the substrate 56 may be selectively controlled relative to one another during fabrication of the TTD module 22, 86. Referring again to FIG. 3, a width of the micro-strip transmission lines 72a, 72b, indicated at 90, and a thickness of the substrate 56, indicated at 92, are illustrated. As indicated previously, varying a width 90 of the micro-strip transmission lines 72a, 72b (and of lines 30 generally, in FIG. 2) alters the characteristic impedance in TTD module 22—with a narrowing of the width 90 increasing the characteristic impedance. Additionally, varying a thickness 92 of the substrate 56 alters the characteristic impedance in TTD module 22—with a thickening of the substrate 56 increasing the characteristic impedance. Various combinations of substrate thickness 56 and micro-strip transmission line width 90—when taken in combination with a length 94 and thickness 96 of the micro-strip transmission lines 72a, 72b and material properties of the substrate 56 and micro-strip transmission lines 72a, 72b (e.g., gallium arsenide (GaAs) substrate and copper lines)—are possible to achieve a desired characteristic impedance in TTD module 22 and examples of such combinations are provided here below in Table 1, with such thicknesses/widths being provided for a prior art 50 Ohm TTD module and for various 150 Ohm TTD modules, according to embodiments of the invention.

TABLE 1

|  | Micro-Strip Width (μm) | Micro-Strip Thickness (μm) | Substrate Thickness (μm) | Characteristic Impedance (Ohms) | Resistive Loss (dB/mm) |
|---|---|---|---|---|---|
| Module #1 (Prior Art) | 270 | 1 | 125 | 49.920 | 0.0118 |
| Module #2 | 18 | 1 | 125 | 148.888 | 0.0417 |
| Module #3 | 70 | 1 | 500 | 151.277 | 0.0121 |
| Module #4 | 42 | 1 | 300 | 150.843 | 0.0193 |

While it can be seen in Table 1 that each of the TTD modules with a characteristic impedance of approximately 150 Ohms (i.e., 150+/−0.0 to 1.3 Ohms) has an increased resistive loss (dB/mm) as compared to the resistive loss in the TTD module with a characteristic impedance of approximately 50 Ohms, it is recognized that the overall resistive loss in the TTD modules is dominated by the contact resistance of the MEMS switches 44, 46. Furthermore, it is recognized that the overall impact of resistive loss in the TTD module is relative to the characteristic impedance of the TTD module—with the impact of resistive loss decreasing as the characteristic impedance of the TTD module increases. Accordingly, for TTD modules with characteristic impedances of 50 Ohms and 150 Ohms, insertion losses for the 150 Ohm TTD module are greatly reduced as compared to the 50 Ohm TTD module. Using the TTD modules 84, 86 of FIGS. 4A and 4B as an example, and assuming that each TTD module has an RF signal path with a minimum of eight (8) MEMS switches through which an RF signal must pass, the insertion losses would be defined as:

$$\text{Insertion Loss(FIG. 4A)} = 10 * \log 10(50/58) = 0.65 \text{ dB}$$

$$\text{Insertion Loss(FIG. 4B)} = 10 * \log 10(150/158) = 0.225 \text{ dB} \quad [\text{Eqn. 1}].$$

Thus, it is seen that an approximate 65% reduction in insertion loss can be achieved in TTD module 86 by constructing the TTD module to have a characteristic impedance of 150 Ohms rather than a characteristic impedance of 50 Ohms. This reduction in the insertion loss in the high impedance TTD module 86 results in an accompanying decrease in DC power consumed by the TTD module.

While it is recognized that the useage of impedance transformers 88 with the TTD module 86 (either positioned at inputs/outputs of the TTD module or formed on the same substrate as the TTD module, so as to be a part thereof) serves to reduce the bandwidth of the RF transmission system, this reduction does not have a negative impact on system operation. That is, as the antenna elements 14 in the radar system 10 (FIG. 1) already limit the bandwidth of the system, the inclusion of impedance transformers 88 in the RF transmission system do not have any additional negative impact on the system bandwidth.

Beneficially, embodiments of the invention thus provide an RF MEMS transmission device (such as a TTD module) having selectively increased characteristic impedance that: reduces insertion losses, improves yields of RF transmission lines in the system, and/or minimizes the planar space of the system. An increasing of the characteristic impedance can be achieved via a thickening of the substrate on which the micro-strip transmission lines are formed, such as to thicknesses of between 100-500 μm, with the thickening of the substrate also providing greater stability during fabrication thereof so as to decrease the risk of wafer breakage and improve line yield (e.g., increase from 20% yield to 80% yield). An increasing of the characteristic impedance can also be achieved via a narrowing of the micro-strip transmission lines, such as to a width of between 20-200 µm, with the narrowing of the micro-strip transmission lines also allowing for a decrease in the planar space of the RF transmission system. The thickening of the substrate and/or the narrowing of the micro-strip transmission lines can be selectively optimized according to a selection process so as to achieve a desired increased impedance—such as 150 Ohms, for example. Impedance transformers can be employed to perform impedance matching between the high impedance RF MEMS transmission system and the lower impedances of the RF source and RF load, with it being recognized that the impedance transformers should not have an adverse affect on the system bandwidth based on antenna elements in the system already limiting the bandwidth of the system.

According to one embodiment of the invention, an RF transmission system includes an RF source that provides an RF input and one or more RF MEMS transmission devices coupled to the RF source to receive the RF input therefrom and generate output signals for transmission to an RF load. Each of the one or more RF MEMS transmission devices comprises a substrate, a conducting line formed on the substrate to provide signal transmission paths between a signal input of the RF MEMS transmission device and a signal output of the RF MEMS transmission device, and a plurality of switching elements positioned along the conducting line and selectively controllable to define the signal transmission paths between the signal input and the signal output. Each of the RF source and the RF load has a first characteristic impedance and the one or more RF MEMS transmission devices have a second characteristic impedance that is greater than the first characteristic impedance.

According to another embodiment of the invention, a method of manufacturing an RF MEMS transmission device includes forming a substrate, forming a signal line on a top surface of the substrate that includes plurality of line portions, and coupling a MEMS switching device to the signal line, the MEMS switching device operable in a closed position and an open position to selectively couple and decouple respective line portions of the signal line to transmit an RF signal therethrough. Forming the substrate and the signal line comprises selectively controlling a thickness of the substrate and a width of the signal line relative to one another such that, when taken in combination with a length and thickness of the signal line and material properties of the substrate and signal line, a characteristic impedance of the RF MEMS transmission device is higher than a 50 Ohm characteristic impedance of an RF source and an RF load to which the RF MEMS transmission device is connected.

According to yet another embodiment of the invention, an RF MEMS transmission device includes a substrate having a thickness, a plurality of MEMS devices disposed on a top surface of the substrate, and conductive signal lines formed on the top surface of the substrate, the conductive signal lines each having a length, width, and thickness. The thickness of the substrate and the width of the conductive signal lines is such that, when taken in combination with others of the thickness of the substrate and the length, width, and thickness of the conductive signal lines, a characteristic impedance of the RF MEMS transmission device is approximately 150 Ohms.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An radio frequency (RF) transmission system comprising:
   an RF source that provides an RF input;
   one or more RF microelectromechanical system (MEMS) transmission devices coupled to the RF source to receive the RF input therefrom and generate output signals for transmission to an RF load, wherein each of the one or more RF MEMS transmission devices comprises:
      a substrate;
      a conducting line formed on the substrate to provide signal transmission paths between a signal input of the RF MEMS transmission device and a signal output of the RF MEMS transmission device; and
      a plurality of switching elements positioned along the conducting line and selectively controllable to define the signal transmission paths between the signal input and the signal output;
   wherein each of the RF source and the RF load has a first characteristic impedance and the one or more RF MEMS transmission devices have a second characteristic impedance that is greater than the first characteristic impedance.

2. The RF transmission system of claim 1 further comprising:
   a first impedance transformer positioned between the RF source and the one or more RF MEMS transmission devices to increase and match the first characteristic impedance of the RF source to the second characteristic impedance of the one or more RF MEMS transmission devices; and
   a second impedance transformer positioned between the one or more RF MEMS transmission devices and the RF load to decrease and match the second characteristic impedance of the one or more RF MEMS transmission devices to the first characteristic impedance of the RF load.

3. The RF transmission system of claim 2 wherein the first and second impedance transformers are provided as separate components from the RF MEMS transmission devices or formed on the substrate of the RF MEMS transmission devices so as to be part of the RF MEMS transmission devices.

4. The RF transmission system of claim 1 wherein the first characteristic impedance of the RF source and the RF load is approximately 50 Ohms and the second characteristic impedance of the one or more RF MEMS transmission devices is approximately 150 Ohms.

5. The RF transmission system of claim 4 wherein the substrate has a thickness and the conducting lines each have a length, width, and thickness, and wherein at least one of the thickness of the substrate and the width of the conducting lines is such that, when taken in combination with others of the thickness of the substrate and the length, width, and thickness of the conducting lines, the characteristic impedance of the RF MEMS transmission device is approximately 150 Ohms.

6. The RF transmission system of claim 5 wherein the thickness of the substrate is between 100 microns and 500 microns.

7. The RF transmission system of claim 5 wherein the width of the conductive signal lines is between 20 microns and 200 microns.

8. The RF transmission system of claim 1 wherein operation of the one or more RF MEMS transmission devices at the second characteristic impedance decreases insertion losses therein as compared to operation at the first characteristic impedance.

9. The RF transmission system of claim 1 wherein each of the one or more RF MEMS transmission devices comprises a true time delay (TTD) module, with the plurality of switching elements comprising:
an input switching element positioned at a first end of each of the plurality of time delay lines; and
an output switching element positioned at a second end of each of the plurality of time delay lines;
with the input switching element and the output switching element being selectively controllable between conducting and non-conducting states to form signal transmission paths of varying lengths between the signal input and the signal output.

10. The RF transmission system of claim 1 wherein the substrate comprises one of glass, alumina, ceramic, LTCC, HTCC, quartz, polyimide, gallium arsenide, silicon, or germanium.

11. The RF transmission system of claim 1 further comprising a ground plane attached to the substrate, with the ground plane and the conducting line forming an RF transmission line for the RF MEMS transmission device.

12. A method of manufacturing a radio frequency (RF) microelectromechanical system (MEMS) transmission device comprising:
forming a substrate;
forming a signal line on a top surface of the substrate, the signal line comprising a plurality of line portions;
coupling a MEMS switching device to the signal line, the MEMS switching device operable in a closed position and an open position to selectively couple and decouple respective line portions of the signal line to transmit an RF signal therethrough;
wherein forming the substrate and the signal line comprises selectively controlling a thickness of the substrate and a width of the signal line relative to one another such that, when taken in combination with a length and thickness of the signal line and material properties of the substrate and signal line, a characteristic impedance of the RF MEMS transmission device is higher than a 50 Ohm characteristic impedance of an RF source and an RF load to which the RF MEMS transmission device is connected.

13. The method of claim 12 wherein the thickness of the substrate and the width of the signal line are selectively controlled to provide a characteristic impedance in the RF MEMS transmission device of approximately 150 Ohms.

14. The method of claim 13 further comprising providing an impedance transformer at each of a signal input and a signal output of the RF MEMS transmission device, so as to provide impedance matching between the 50 Ohm RF source and RF load and the approximately 150 Ohm RF MEMS transmission device, the impedance transformers being formed on the substrate of the RF MEMS transmission device or provided as separate and distinct components.

15. The method of claim 14 wherein the plurality of line portions of the signal line comprise a plurality of delay lines defining alternative paths between the signal input and the signal output of the RF MEMS transmission device, so as to form a true time delay (TTD) module.

16. The method of claim 12 wherein selectively controlling the thickness of the substrate and the width of the signal line comprises forming the substrate to have a thickness of between 100 microns and 500 microns and forming the signal line to have a width of between 20 microns and 200 microns.

17. A radio frequency (RF) microelectromechanical system (MEMS) transmission device comprising:
a substrate having a thickness;
a plurality of MEMS devices disposed on a top surface of the substrate; and
conductive signal lines formed on the top surface of the substrate, the conductive signal lines each having a length, width, and thickness;
wherein the thickness of the substrate and the width of the conductive signal lines is such that, when taken in combination with others of the thickness of the substrate and the length, width, and thickness of the conductive signal lines, a characteristic impedance of the RF MEMS transmission device is approximately 150 Ohms.

18. The RF MEMS transmission device of claim 17 wherein the thickness of the substrate is between 150 microns and 500 microns.

19. The RF MEMS transmission device of claim 17 wherein the width of the conductive signal lines is between 20 microns and 200 microns.

20. The RF MEMS transmission device of claim 17 further comprising a ground plane positioned on a bottom surface of the substrate, with the ground plane and the plurality of conductive signal lines forming an RF transmission line.

21. The RF MEMS transmission device of claim 17 wherein each of the plurality of MEMS devices comprises a MEMS switch having an open position configured to decouple segments of a respective signal line and a closed position configured to couple segments of the respective signal line.

* * * * *